United States Patent
Hsu et al.

(10) Patent No.: US 9,589,966 B2
(45) Date of Patent: *Mar. 7, 2017

(54) STATIC RANDOM ACCESS MEMORY

(71) Applicant: UNITED MICROELECTRONICS CORP., Hsin-Chu (TW)

(72) Inventors: Chih-Kai Hsu, Tainan (TW); Chao-Hung Lin, Changhua County (TW); Yu-Hsiang Hung, Tainan (TW); Ssu-I Fu, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 32 days.

This patent is subject to a terminal disclaimer.

(21) Appl. No.: 14/724,775

(22) Filed: May 28, 2015

(65) Prior Publication Data

US 2016/0322366 A1 Nov. 3, 2016

(30) Foreign Application Priority Data

Apr. 30, 2015 (CN) .......................... 2015 1 0216456

(51) Int. Cl.
*H01L 27/11* (2006.01)
*H01L 27/02* (2006.01)

(52) U.S. Cl.
CPC ...... *H01L 27/1104* (2013.01); *H01L 27/0207* (2013.01)

(58) Field of Classification Search
USPC .................... 365/72, 154; 257/E21.53; 438/7
See application file for complete search history.

(56) References Cited

U.S. PATENT DOCUMENTS

| 9,379,119 B1* | 6/2016 | Huang ................ H01L 27/1104 |
| 2013/0258759 A1 | 10/2013 | Liaw |
| 2014/0241027 A1 | 8/2014 | Hung et al. |

* cited by examiner

*Primary Examiner* — Hrayr A Sayadian
(74) *Attorney, Agent, or Firm* — Winston Hsu; Scott Margo

(57) ABSTRACT

A static random access memory (SRAM) is disclosed. The SRAM includes a plurality of SRAM cells on a substrate, in which each of the SRAM cells comprises: a gate structure on the substrate; a first interlayer dielectric (ILD) layer around the gate structure; a first contact plug in the first ILD layer; a second ILD layer on the first ILD layer; and a second contact plug in the second ILD layer and electrically connected to the first contact plug.

17 Claims, 5 Drawing Sheets

STATIC RANDOM ACCESS MEMORY

BACKGROUND OF THE INVENTION

1. Field of the Invention

The invention relates to a static random access memory (SRAM), and more particularly, to a SRAM having two interlayer dielectric (ILD) layers and contact plugs formed among the two ILD layers.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

However, as pitch of the exposure process decreases, it has been difficult for current SRAM architecture to produce desirable patterns. Hence, how to enhance the current SRAM architecture for improving exposure quality has become an important task in this field.

SUMMARY OF THE INVENTION

According to a preferred embodiment of the present invention, a static random access memory (SRAM) is disclosed. The SRAM includes a plurality of SRAM cells on a substrate, in which each of the SRAM cells comprises: a gate structure on the substrate; a first interlayer dielectric (ILD) layer around the gate structure; a first contact plug in the first ILD layer; a second ILD layer on the first ILD layer; and a second contact plug in the second ILD layer and electrically connected to the first contact plug.

According to another aspect of the present invention, a static random access memory (SRAM) is disclosed. The SRAM includes a first SRAM cell on a substrate, in which the first SRAM cell further includes: a first gate structure on the substrate; a first interlayer dielectric (ILD) layer around the first gate structure; a first contact plug in the first ILD layer; a second ILD layer on the first ILD layer; and a second contact plug in the second ILD layer and electrically connected to the first contact plug. Preferably, the second contact plug and the first contact plug comprise a misalignment therebetween.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
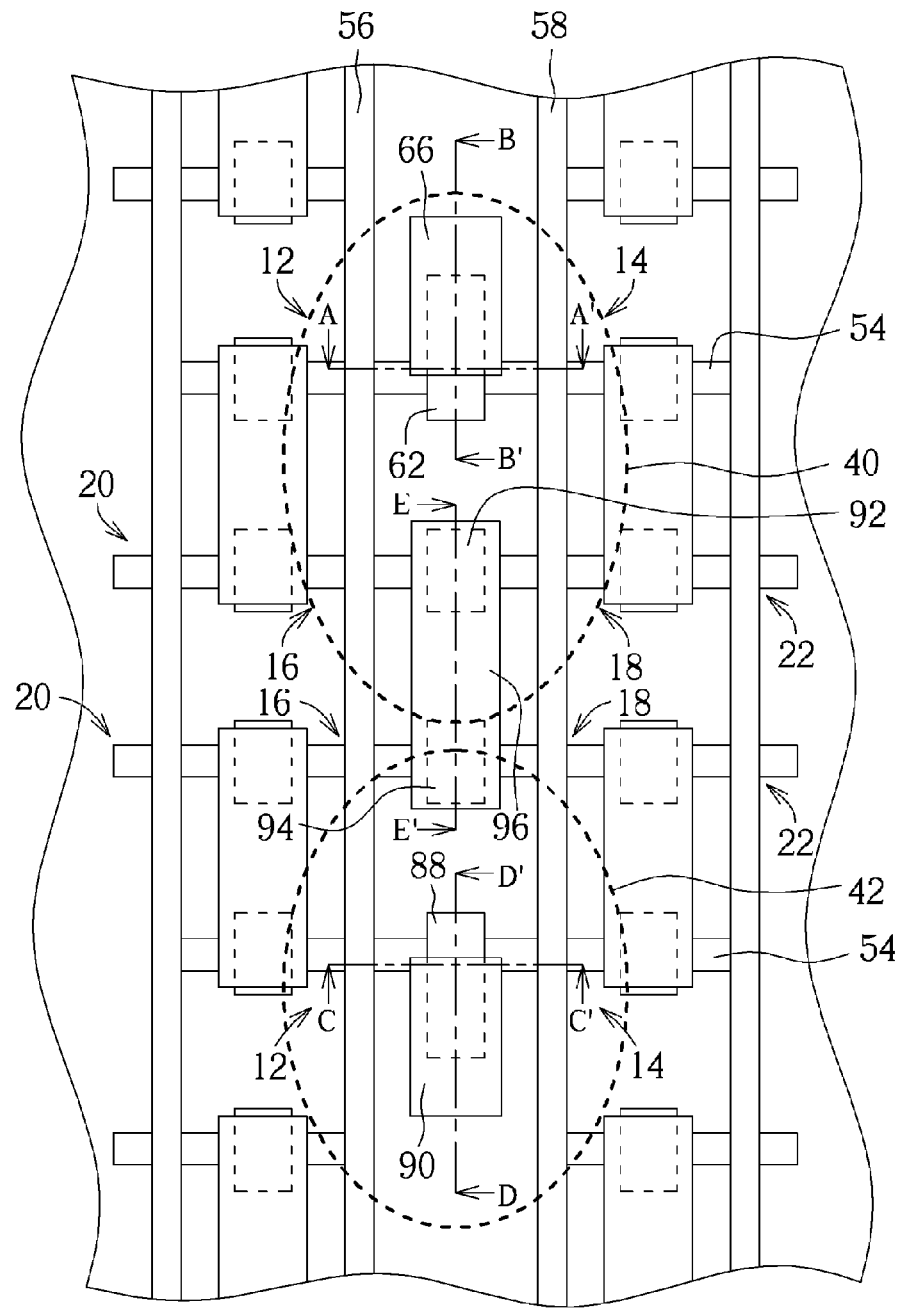
FIG. 1 illustrates a layout diagram of a SRAM according to a preferred embodiment of the present invention.
Figure 2:
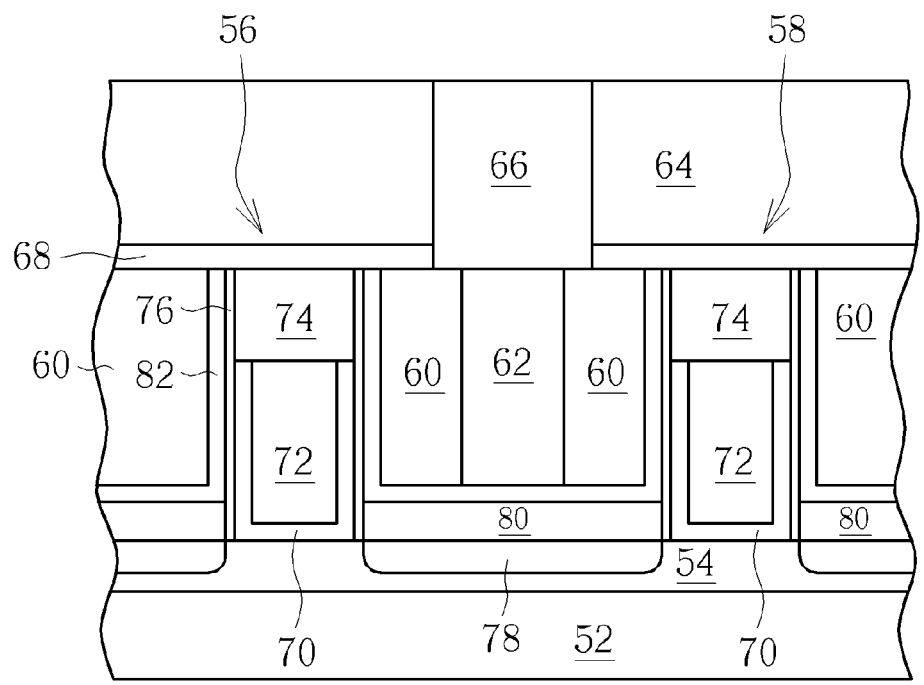
FIG. 2 illustrates a cross-sectional view of FIG. 1 along the sectional line AA'.
Figure 3:
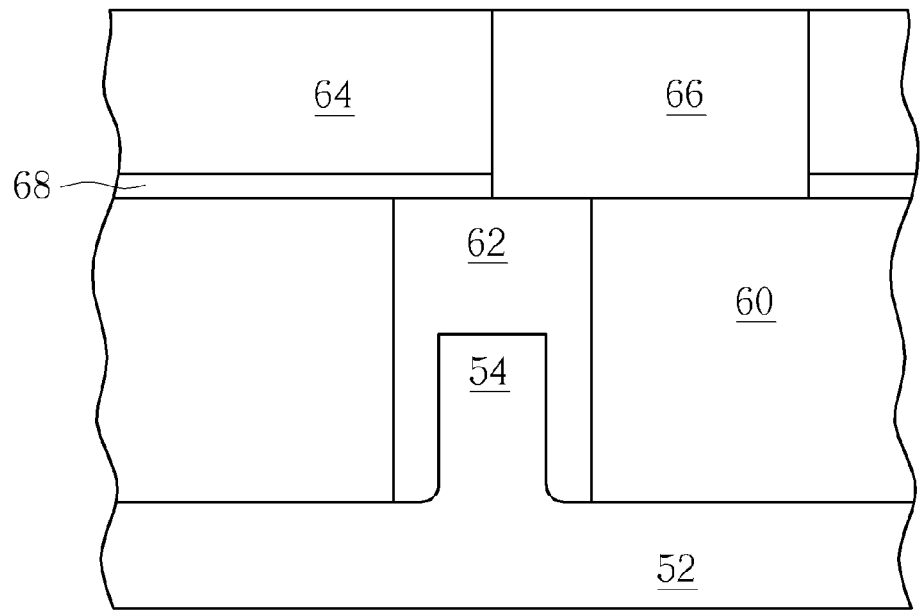
FIG. 3 illustrates a cross-sectional view of FIG. 1 along the sectional line BB'.
Figure 4:
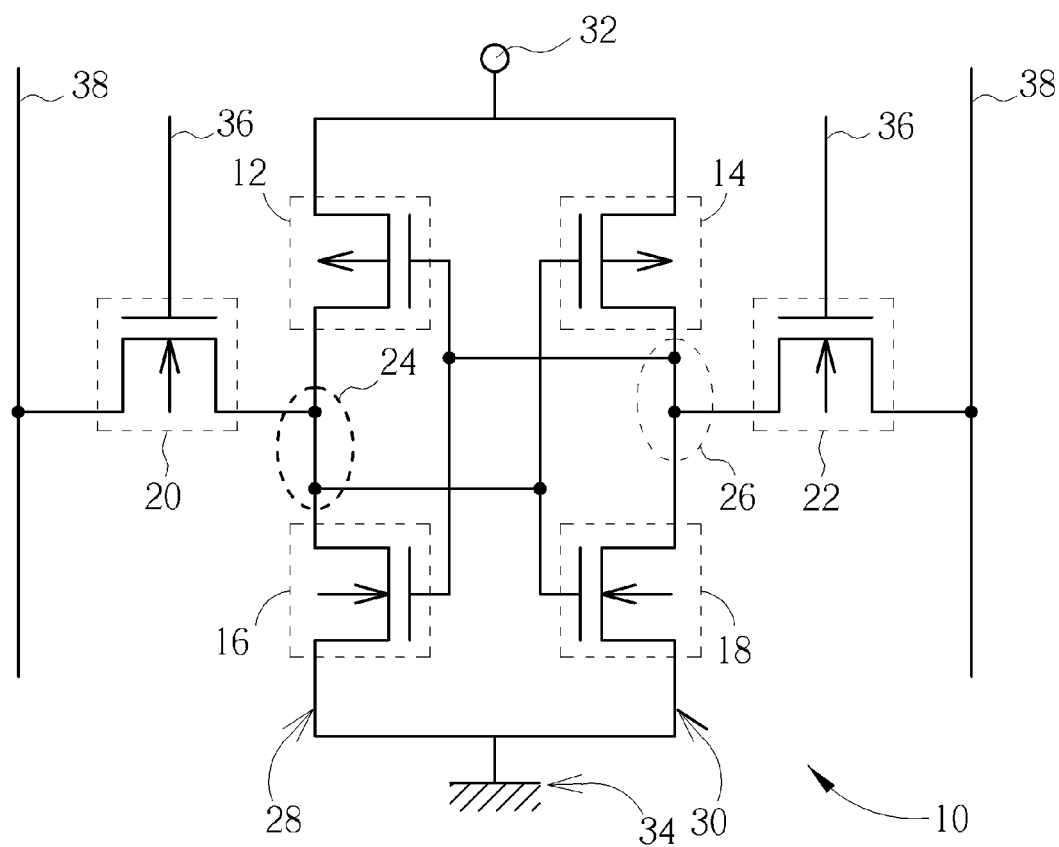
FIG. 4 illustrates a circuit diagram of a six-transistor SRAM (6T-SRAM) cell of a SRAM of the present invention.

Referring to FIGS. 1-4, FIG. 1 illustrates a layout diagram of a SRAM according to a preferred embodiment of the present invention, FIG. 2 illustrates across-sectional view of FIG. 1 along the sectional line AA', FIG. 3 illustrates a cross-sectional view of FIG. 1 along the sectional line BB', and FIG. 4 illustrates a circuit diagram of a six-transistor SRAM (6T-SRAM) cell of a SRAM of the present invention.

As shown in FIGS. 1-4, the SRAM device of the present invention preferably includes at least two SRAM cells, such as a first SRAM cell 40 and a second SRAM cell 42, in which each of the first SRAM cell 40 and second SRAM cell 42 includes a 6T-SRAM cell 10. In this embodiment, each 6T-SRAM cell 10 is composed of pull-up transistors 12 and 14, pull-down transistors 16 and 18, and access transistors 20 and 22. These six transistors constitute a set of flip-flops. Pull-up transistors 12 and 14 and pull-down transistors 16 and 18 constitute a latch that stores data in the storage nodes 24 and 26. Since the pull-up transistors 12 and 14 act as power load devices, they can be replaced by resistors. Under this circumstance, the static random access memory becomes a four-transistors SRAM (4T-SRAM). In this embodiment, the pull-up transistors 12 and 14 preferably share a source/drain region and electrically connected to a voltage source (such as Vcc), the pull-down transistors 16 and 18 share a source/drain region and electrically connected to a voltage source 34 (such as Vss), and the first SRAM cell 40 and second SRAM cell 42 are arranged symmetrically while being mirror images to each other so that the source/drain region shared by the pull-down transistors 16 and 18 of the first SRAM cell 40 is electrically connected to the source/drain region shared by the pull-up transistors 12 and 14 of the second SRAM cell 42.

Preferably, the pull-up transistors 12 and 14 of the 6T-SRAM cell 10 are composed of p-type metal oxide semiconductor (PMOS) transistors, the pull-down transistors 16 and 18 and the access transistors 20 and 22 are composed of n-type metal oxide semiconductor (NMOS) transistors. The pull-up transistor 12 and the pull-down transistor 16 constitute an inverter, which further form a series circuit 28. One end of the series circuit 28 is connected to a voltage source 32 and the other end of the series circuit 28 is connected to a voltage source 34. Similarly, the pull-up transistor 14 and the pull-down transistor 18 constitute another inverter and a series circuit 30. One end of the series circuit 30 is connected to the voltage source 32 and the other end of the series circuit 30 is connected to the voltage source 34.

The storage node 24 is connected to the respective gates of the pull-down transistor 18 and the pull-up transistor 14. The storage node 24 is also connected to the drains of the pull-down transistor 16, pull-up transistor 12, and the access transistor 20. Similarly, the storage node 26 is connected to the respective gates of the pull-down transistor 16 and the pull-up transistor 12. The storage node 26 is also connected to the drains of the pull-down transistor 18, pull-up transistor 14, and the access transistor 22. The gates of the access transistors 20 and 22 are respectively coupled to a word line 36, and the sources are coupled to a relative data line 38.

In this embodiment, both the first SRAM cell 40 and second SRAM cell 42 are disposed on a substrate 52, such as a silicon substrate or silicon-on-insulator (SOI) substrate. A plurality of fin-shaped structures 54 are formed on the substrate 54 and shallow trench isolations (STIs) (not shown) are formed around the fin-shaped structures 54.

As shown in FIG. 2, the pull-up transistors 12 and 14 of the first SRAM cell 40 include gate structures 56 and 58 disposed on the substrate 52, a first interlayer dielectric (ILD) layer 60 around the gate structures 56 and 58, a first contact plug 62 disposed within the first ILD layer 60, a second ILD layer 64 disposed on the first ILD layer 62, a second contact plug 66 in the second ILD layer 64 and electrically connected to the first contact plug 62, and a stop layer 68 disposed between the first ILD layer 60 and the second ILD layer 64. Each of the gate structures 56 and 58 is composed of a metal gate having high-k dielectric layer (not shown), U-shaped work function metal layer 70, low resistance metal layer 72, and hard mask 74, and elements including spacers 76, source/drain region 78, epitaxial layer 80, and contact etch stop layer (CESL) 82 are formed adjacent to two sides of the gate structures 56 and 58.

Specifically, the pull-up transistors 12 and 14 share a common source region 78, in which the source region 78 is electrically connected to the voltage source 32 (such as Vcc) through the second contact plug 66 and first contact plug 62 and the second contact plug 66 and the first contact plug 62 share a misalignment therebetween. For instance, viewing from FIGS. 2-3, an edge of the second contact plug 66 and the top surface of the first contact plug 62 constitute a step-shaped profile altogether. If viewing from a top view such as FIG. 1, the first contact plug 62 preferably overlaps at least two edges of the fin-shaped structure 54. The second contact plug 66 on the other hand, only overlaps part of the fin-shaped structure 54, such as overlapping only a single edge of the fin-shaped structure 54 while extending upward. If viewing from a cross-sectional view such as FIG. 3, the first contact plug 62 preferably overlaps or directly contacts at least three edges of the fin-shaped structure 54, including the top surface and two sidewalls of the fin-shaped structure 54. The second contact plug 66 on the other hand overlaps one edge of the fin-shaped structure 54, such as a sidewall of the fin-shaped structure 54.

Figure 5:
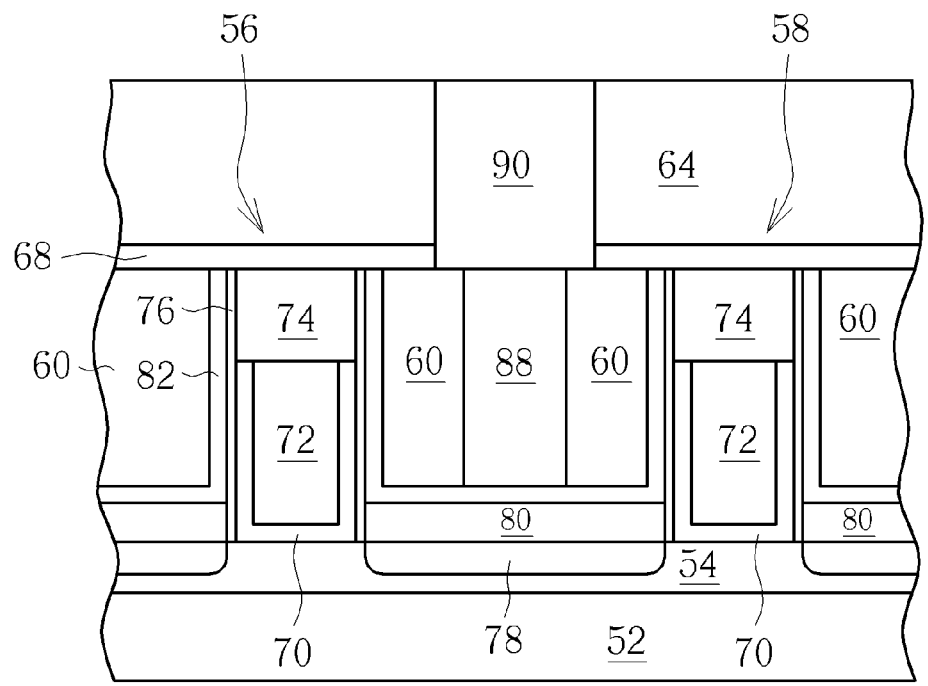
FIG. 5 illustrates a cross-sectional view of FIG. 1 along the sectional line CC'.
Figure 6:
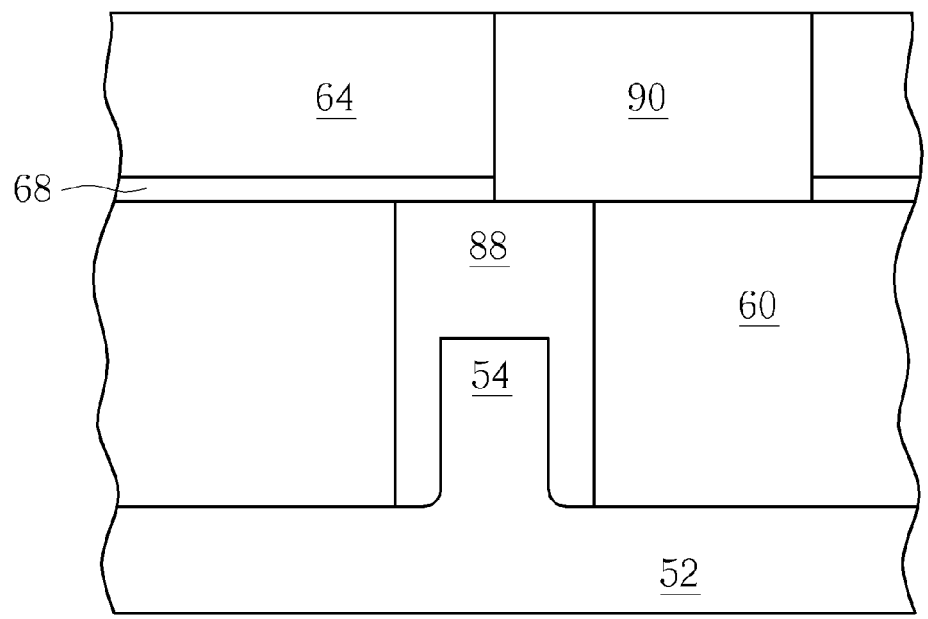
FIG. 6 illustrates a cross-sectional view of FIG. 1 along the sectional line DD'.

Referring to FIGS. 5-6, FIG. 5 illustrates a cross-sectional view of FIG. 1 along the sectional line CC', FIG. 6 illustrates a cross-sectional view of FIG. 1 along the sectional line DD'. Similar to the aforementioned pull-up transistors 12 and 14 from first SRAM cell 40, the pull-up transistors 12 and 14 of the second SRAM cell 42 includes gate structures 56 and 58 disposed on the substrate 52, a first ILD layer 60 around the gate structures 56 and 58, a third contact plug 88 disposed within the first ILD layer 60, a second ILD layer 64 disposed on the first ILD layer 60, a fourth contact plug 90 disposed in the second ILD layer 64 and electrically connected to the third contact plug 88, and a stop layer 68 disposed between the first ILD layer 60 and the second ILD layer 64.

Each of the gate structures 56 and 58 is composed of a metal gate having high-k dielectric layer (not shown), U-shaped work function metal layer 70, low resistance metal layer 72, and hard mask 74, and elements including spacers 76, source/drain region 78, epitaxial layer 80, and contact etch stop layer (CESL) 82 are formed adjacent to two sides of the gate structures 56 and 58. It should be noted that the first ILD layer 60 and second ILD layer 64 surrounding gate structures 56 and 58 of the pull-up transistors 12 and 14 of the second SRAM cell 42 are literally the first ILD layer 60 and second ILD layer 64 surrounding the gate structures 56 and 58 of the pull-up transistors 12 and 14 of the first SRAM cell 40.

Similarly, the pull-up transistors 12 and 14 of the second SRAM cell 42 share a common source region 78, in which the source region 78 is electrically connected to the voltage source 32 (such as Vcc) through the fourth contact plug 90 and third contact plug 88 and the fourth contact plug 90 and the third contact plug 88 of the second SRAM cell 42 also share a misalignment therebetween. For instance, viewing from FIGS. 5-6, an edge of the fourth contact plug 90 and the top surface of the third contact plug 88 constitute a step-shaped profile altogether. If viewing from a top view such as FIG. 1, the third contact plug 88 preferably overlaps at least two edges of the fin-shaped structure 54. The fourth contact plug 90 on the other hand, only overlaps part of the fin-shaped structure 54, such as overlapping only a single edge of the fin-shaped structure 54 while extending downward. If viewing from a cross-sectional view such as FIG. 6, the third contact plug 88 preferably overlaps or directly contacts at least three edges of the fin-shaped structure 54, including the top surface and two sidewalls of the fin-shaped structure 54. The fourth contact plug 90 on the other hand overlaps one edge of the fin-shaped structure 54, such as a sidewall of the fin-shaped structure 54.

Figure 7:
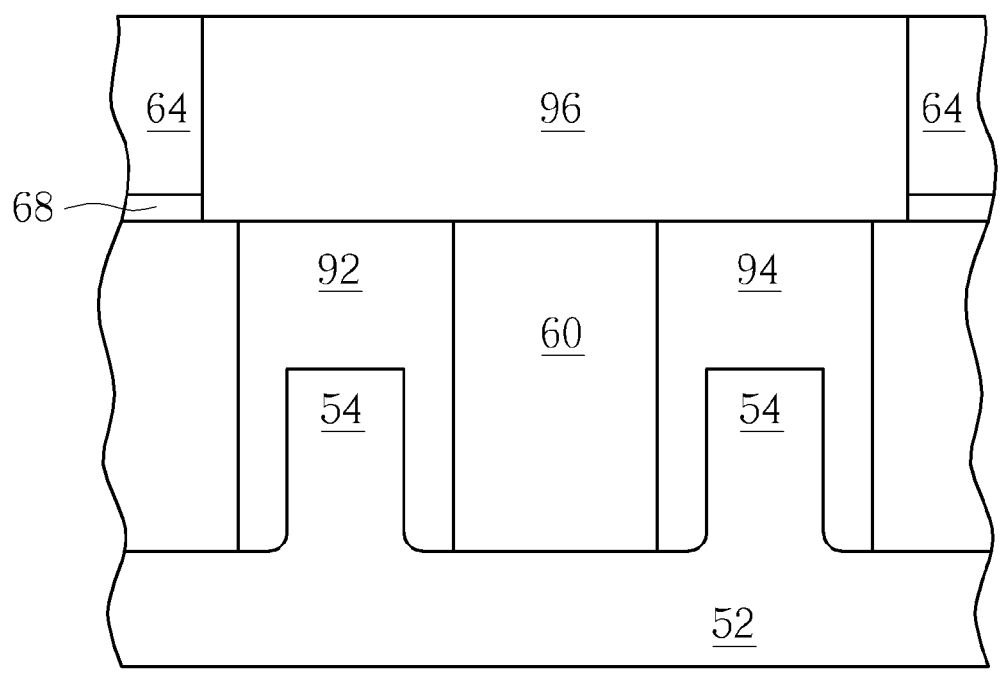
FIG. 7 illustrates a cross-sectional view of FIG. 1 along the sectional line EE'.

Referring to FIG. 7, FIG. 7 illustrates a cross-sectional view of FIG. 1 along the sectional line EE'. As shown in FIGS. 1 and 7, the source/drain region shared by the pull-down transistors 16 and 18 of first SRAM cell 40 is electrically connected to the source/drain region shared by the pull-down transistors 16 and 18 of the second SRAM cell 42, in which the shares source/drain regions are further electrically connected to the voltage source 34 (such as Vss) through a fifth contact plug 92, a sixth contact plug 94, and a seventh contact plug 96. Preferably, the seventh contact plug 96 is disposed to overlap the fifth contact plug 92 and sixth contact plug 94 entirely without any misalignment. If viewing from a top view such as FIG. 1, the fifth contact plug 92 and sixth contact plug 94 preferably overlap at least two edges of the fin-shaped structure 54 while the seventh contact plug 96 overlaps at least four edges of the fin-shaped structure 54. If view from a cross-sectional view such as FIG. 7, each of the fifth contact plug 92 and the sixth contact plug 94 overlaps at least three edges of the fin-shaped structure 54, including the top surface and two sidewalls of the fin-shaped structure 54. The seventh contact plug 96 on the other hand overlaps at least four edges of the fin-shaped structure 54, including four sidewalls of the fin-shaped structure 54.

Overall, the present invention preferably extends the overall length and area of the second contact plug embedded in second ILD layer and above first ILD layer by extending the length and area of the first contact plug embedded within the first ILD layer. By doing so, a misalignment is also created between the first contact plug and the second contact plug. According to a preferred embodiment of the present invention, the misalignment between the top surface of first contact plug and at least a sidewall of second contact plug is revealed by a step-shaped profile, while the extended second contact plug only overlaps part of the fin-shaped structure when viewing from the top. By using the shift in position of the second contact plug, it would be desirable to extend the distance between source/drain region of pull-up transistors and source/drain region of pull-down transistors of the SRAM cell, or extend the distance between the Vcc voltage source of pull-up transistors and Vss voltage source of pull-down transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM), comprising:
a plurality of SRAM cells on a substrate, wherein each of the SRAM cells comprises:
a gate structure on the substrate;
a first interlayer dielectric (ILD) layer around the gate structure;
a first contact plug in the first ILD layer;
a second ILD layer on the first ILD layer; and
a second contact plug in the second ILD layer and electrically connected to the first contact plug.

2. The SRAM of claim 1, wherein each of the SRAM cells comprises two pull-up transistors, two pull-down transistors, and two access transistors.

3. The SRAM of claim 1, further comprising a stop layer between the first ILD layer and the second ILD layer.

4. A static random access memory (SRAM), comprising:
a first SRAM cell on a substrate, comprising:
a first gate structure on the substrate;
a first interlayer dielectric (ILD) layer around the first gate structure;
a first contact plug in the first ILD layer;
a second ILD layer on the first ILD layer; and
a second contact plug in the second ILD layer and electrically connected to the first contact plug, wherein the second contact plug and the first contact plug comprise a misalignment therebetween.

5. The SRAM of claim 4, wherein an edge of the second contact plug and the top surface of the first contact plug comprise a step profile therebetween.

6. The SRAM of claim 4, further comprising at least one fin-shaped structure on the substrate.

7. The SRAM of claim 6, wherein the first contact plug overlaps at least two edges of the fin-shaped structure and the second contact plug only partially overlaps the fin-shaped structure.

8. The SRAM of claim 4, further comprising a stop layer between the first ILD layer and the second ILD layer.

9. The SRAM of claim 4, wherein the first SRAM cell comprises two pull-up transistors, two pull-down transistors, and two access transistors, wherein one of the two pull-up transistors comprises:
the first gate structure on the substrate;
the first interlayer dielectric (ILD) layer around the first gate structure;
the first contact plug in the first ILD layer;
the second ILD layer on the first ILD layer; and
the second contact plug in the second ILD layer and electrically connected to the first contact plug, wherein the second contact plug and the first contact plug comprise a misalignment therebetween.

10. The SRAM of claim 4, wherein the SRAM device comprises two pull-up transistors, two pull-down transistors, and two access transistors, wherein each of the two pull-up transistors comprises:
the first gate structure on the substrate;
the first ILD layer around the gate structure;
the first contact plug in the first ILD layer;
the second ILD layer on the first layer; and
the second contact plug in the second ILD layer and electrically connected to the first contact plug, wherein the second contact plug and the first contact plug comprise a misalignment therebetween.

11. The SRAM of claim 4, further comprising a second SRAM cell electrically connected to the first SRAM cell, the second SRAM cell comprises:
a second gate structure on the substrate;
the first interlayer dielectric (ILD) layer around the second gate structure;
a third contact plug in the first ILD layer;
the second ILD layer on the first ILD layer; and
a fourth contact plug in the second ILD layer and electrically connected to the third contact plug, wherein the fourth contact plug and the third contact plug comprise a misalignment therebetween.

12. The SRAM of claim 11, wherein an edge of the fourth contact plug and the top surface of the third contact plug comprise a step profile therebetween.

13. The SRAM of claim 11, further comprising at least one fin-shaped structure on the substrate.

14. The SRAM of claim 13, wherein the third contact plug overlaps at least two edges of the fin-shaped structure and the fourth contact plug only partially overlaps the fin-shaped structure.

15. The SRAM of claim 11, further comprising a stop layer between the first ILD layer and the second ILD layer.

16. The SRAM of claim 11, wherein the second SRAM cell comprises two pull-up transistors, two pull-down transistors, and two access transistors, wherein one of the two pull-up transistors comprises:
the second gate structure on the substrate;
the first interlayer dielectric (ILD) layer around the second gate structure;
the third contact plug in the first ILD layer;
the second ILD layer on the first ILD layer; and
the fourth contact plug in the second ILD layer and electrically connected to the third contact plug, wherein the fourth contact plug and the third contact plug comprise a misalignment therebetween.

17. The SRAM of claim 11, wherein the second SRAM cell comprises two pull-up transistors, two pull-down transistors, and two access transistors, wherein each of the two pull-up transistors comprises:
the second gate structure on the substrate;
the first interlayer dielectric (ILD) layer around the second gate structure;
the third contact plug in the first ILD layer;
the second ILD layer on the first ILD layer; and
the fourth contact plug in the second ILD layer and electrically connected to the third contact plug, wherein the fourth contact plug and the third contact plug comprise a misalignment therebetween.

* * * * *